(12) United States Patent
Hirata

(10) Patent No.: US 7,044,764 B2
(45) Date of Patent: May 16, 2006

(54) SOCKET FOR A PIN GRID ARRAY PACKAGE

(75) Inventor: Toshihisa Hirata, Kamato (JP)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 10/484,957

(22) PCT Filed: Jul. 22, 2002

(86) PCT No.: PCT/US02/23058

§ 371 (c)(1),
(2), (4) Date: Jul. 6, 2004

(87) PCT Pub. No.: WO03/012929

PCT Pub. Date: Feb. 13, 2003

(65) Prior Publication Data

US 2004/0242048 A1    Dec. 2, 2004

(30) Foreign Application Priority Data

Jul. 30, 2001    (JP) .............................. 2001-229273

(51) Int. Cl.
*H01R 13/625*    (2006.01)
(52) U.S. Cl. ...................... 439/342; 439/378; 439/680; 439/264; 439/525
(58) Field of Classification Search ................ 439/378, 439/680, 330, 342, 264, 525–526
See application file for complete search history.

(56) References Cited

U.S. PATENT DOCUMENTS

| 5,167,515 | A | * | 12/1992 | Matsuoka et al. | .......... 439/108 |
| 5,489,217 | A | * | 2/1996 | Scheitz et al. | .............. 439/342 |
| 5,567,177 | A | * | 10/1996 | Foerstel et al. | ............. 439/526 |
| 6,375,485 | B1 | * | 4/2002 | Lin | ............................ 439/342 |
| 6,626,683 | B1 | * | 9/2003 | Lai | .............................. 439/73 |

* cited by examiner

*Primary Examiner*—Truc Nguyen
(74) *Attorney, Agent, or Firm*—Robert J. Zeitler

(57) ABSTRACT

A PGA socket having structure that permits the slide plate to be kept center-aligned while moving on the base housing, thus assuring that reliable electric connections be established between the PGA lead pins and the terminals of the socket. The PGA socket includes a base housing and a slide plate, the slide plate being movable between a first, or lead pin inserting position, in which the lead pins of the pin grid array package can be inserted in the through holes and the terminal mounts and a second, or locking position, in which the lead pins are applied to the terminals in the terminal mounts. The PGA socket includes at least one resilient piece on either the base housing or the slide plate and that other of the base housing or slide plate has an engagement means for receiving the at least one resilient piece. The resilient piece may be engaged with the engagement means in such a manner that the slide plate is kept aligned relative to its center when it is operated between the first position and the second position. Moreover, the PGA socket may include two resilient pieces, and the two resilient pieces may be arranged symmetrically with respect to the centerline of the base housing.

20 Claims, 3 Drawing Sheets

SOCKET FOR A PIN GRID ARRAY PACKAGE

FIELD OF THE INVENTION

The present invention relates to a socket for a pin grid array package ("PGA").

BACKGROUND OF THE INVENTION

Conventional PGA sockets comprise a base housing having the corresponding plurality of terminals set in its terminal mounts, which are arranged in the same grid pattern as the lead pins of the pin grid array package, and a slide plate having the corresponding plurality of through holes made and arranged in the same grid pattern. Each through hole corresponds to one of the terminals, and the slide plate is movable between the lead pin-inserting position in which the lead pins of the pin grid array package can be inserted in the through holes and the terminal mounts, requiring little or no pushing force, and the locking position in which the lead pins are applied to, and put in contact with the terminals in the terminal mounts.

The slide plate has slide means to move the slide plate back and forth on the base housing. One example of slide means comprises a cam axle rotatably fixed to one lateral edge and an operating handle attached to one longitudinal side of the base housing for rotating the cam axle, as for instance, is shown in Japanese Patent Application Laid-Open No.7-142134. Another example of slide means comprises a cam member passing through the slide plate and the underlying base housing, and the cam member can be rotated by using a screw driver to move the slide plate on the base housing back and forth, as for instance, is shown in Japanese Patent Application Laid-Open No. 11-513837.

The PGA socket uses the base housing and the slide plate, which can be moved on the base housing back and forth. As a matter of fact, however, these base housing and slide plate are combined together more loosely than required to permit the sliding of the slide plate on the base housing because of the allowance or tolerance. Such significant looseness causes little or no problem, provided that an associated PGA package has so small number of lead pins that adjacent lead pins may be separated a relatively large distance, compared with the allowance. As a general tendency the number of lead pins in PGA sockets has been increasing, and accordingly the pin-to-pin distance has been decreasing to the extent that the excessive looseness may cause an adverse effect in making a required electric connection.

SUMMARY OF THE INVENTION

In view of the above, one object is to provide a PGA socket free of excessive looseness between its base housing and slide plate that could cause an adverse effect in making a required electric connection.

Another object is to provide a PGA socket having structure that permits the slide plate to be kept center-aligned while moving on the base housing, thus assuring that reliable electric connections be established between the PGA lead pins and the terminals of the socket.

To attain these and other objects, the present application discloses a socket for a pin grid array package, the socket including a base housing and a slide plate, the slide plate being movable between a first, or lead pin inserting position, in which the lead pins of the pin grid array package can be inserted in the through holes and the terminal mounts and a second, or locking position, in which the lead pins are applied to the terminals in the terminal mounts. The PGA socket includes at least one resilient piece on either the base housing or the slide plate and that other of the base housing or slide plate has an engagement means for receiving the at least one resilient piece.

The resilient piece may be engaged with the engagement means in such a manner that the slide plate is kept aligned relative to its center when it is operated between the first position and the second position.

The PGA socket may include two resilient pieces, and the two resilient pieces may be arranged symmetrically with respect to the centerline of the base housing.

The base housing may have the resilient piece or pieces provided on one lateral edge of the base housing whereas the slide plate may have the resilient piece or pieces provided on the other lateral edge of the slide plate.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which.

DETAILED DESCRIPTION OF THE ILLUSTRATED EMBODIMENT

Figure 1:
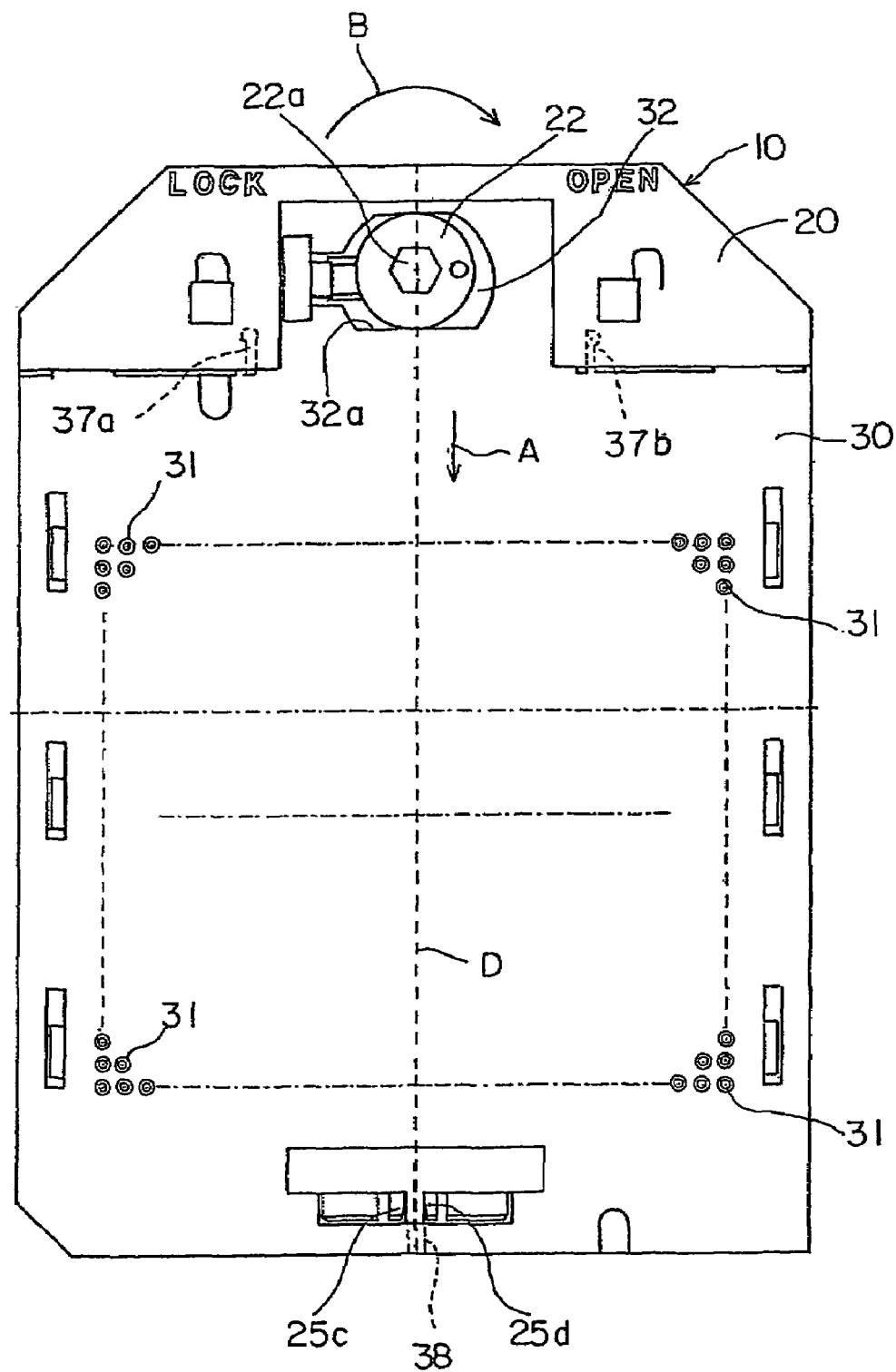
FIG. 1 is a top view of a PGA socket according to the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

Referring to FIG. 1, a PGA socket 10 according to the present invention comprises a rectangular base housing 20 and an overlying slide plate 30.

Figure 2:
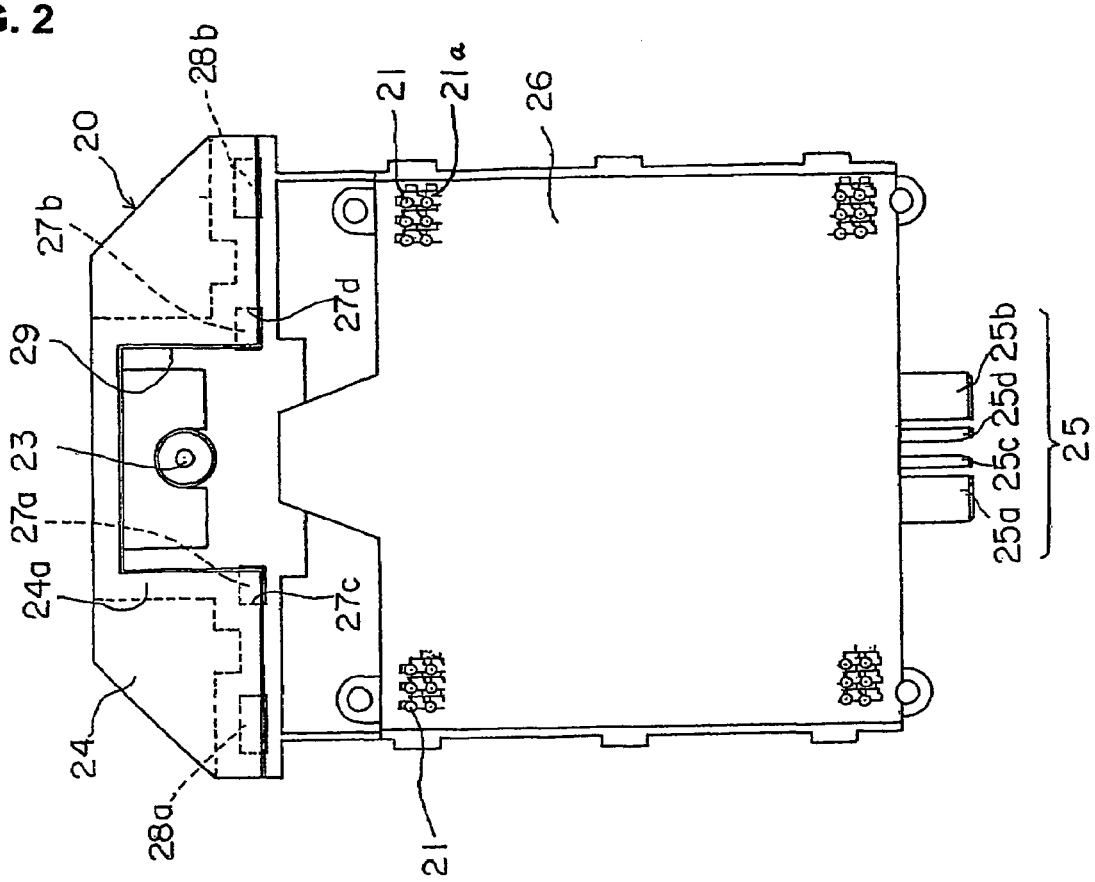
FIG. 2 is a top view of the base housing of the PGA socket of FIG. 1.

The base housing 20 has as many terminals 21 as the lead pins of a PGA set in its terminal mounts (see FIG. 2). The terminal mounts 21a are arranged in the same pattern as the lead pins of the pin grid array package. Each terminal 21 has a tail extending on its rear side, and when the terminal is put in a selected terminal mount, the tail appears on the bottom surface of the base housing 20. Each terminal mount is open on its top side to accommodate a selected lead pin of a PGA package.

The slide plate 30 has as many through holes 31 as the terminals 21 made and arranged in the same pattern as the lead pins of the pin grid array. Each through hole is allotted to each of the terminals 21. The slide plate 30 has two, "L"-shaped plates integrally connected to its opposite longitudinal sides, and the slide plate 30 is movably laid on the base housing 20 with the "L"-shaped plates fitted on the guide ridges of the opposite longitudinal sides of the base housing 20. Thus, the slide plate 30 can be moved back and forth between the lead pin-inserting position in which the lead pins of the pin grid array package can be inserted in the through holes 31 and the terminal mounts and the locking position in which the lead pins are applied to the terminals 21 in the terminal mounts.

A cam member 22 has a hexagonal hole 22a made at its center, and the cam member 22 is rotatably fixed to one lateral side of the base housing 20 and the slide plate 30 has a oblong-shaped aperture 32 made on one lateral side of the slide plate 30. The slide plate 30 is laid on the base housing 20 with the cam member 22 fitted in the oblong-shaped aperture 32. Initially, the slide plate 30 is put in the lead pin-inserting position (see FIG. 1), in which the lead pins of the pin grid array package can be inserted in the through holes 31 of the slide plate 30 and the terminal mounts of the base housing 20 without the necessity of applying a significant strength of pushing force to the pin grid package.

When the cam member 22 is rotated 180 degrees clockwise as indicated by arrow B about an offset pivot axis 23 (see FIG. 2) by inserting a hexagonal shaped tool in the hexagonal hole 22a and by rotating the tool, the cam member 22 pushes the counter side 32a of the oblong-shaped aperture 32 to move the slide plate 30 on the base housing 20 in the direction as indicated by arrow A, thereby displacing each and every through hole 31 a certain short distance relative to the stationary terminal 21. Thus, the slide plate 30 is put in the locking position in which the lead pins in the through holes 31 of the slide plate 30 are applied to the stationary terminals 21 in the terminal mounts of the base housing 20. Thus, a good electrical connection can be made between each lead pin of the PGA and the counter terminal 31 of the PGA socket.

As seen from FIG. 2, the base housing 20 has a shoulder section 24 formed on one lateral side, and a set of projections 25 formed on the other lateral side. The terminals 21 are mounted in the main flat plate 26 of the base housing 20. The shoulder section 24 is composed of an intermediate plate 24a and an upper plate, both of which are integrally connected to the main flat plate 26 of the base housing 20. The upper plate has a rectangular recess formed at its middle, and the cam pivot hole 23 is made at the center of the rectangular recess. The cam member 22 is fixed to the cam seat 29, which is defined by the rectangular recess.

The geometry of the base housing 20 is symmetric with respect to the center longitudinal line D. The intermediate plate 24a has two recesses 27a and 27b made at the lower, opposite corners of the rectangular cam seat 29, and two recesses 28a and 28b made in the vicinities of the opposite longitudinal sides of the base housing 20.

The set of projections 25 are two relative narrow resilient projections 25c and 25d and two wide rigid projections 25a and 25b. The resilient projections 25c and 25d are symmetric with respect to the center longitudinal line D, and the rigid projections 25a and 25b are arranged so close to the resilient projections 25c and 25d as to prevent the resilient projections 25c and 25d from being bent largely.

Figure 3:
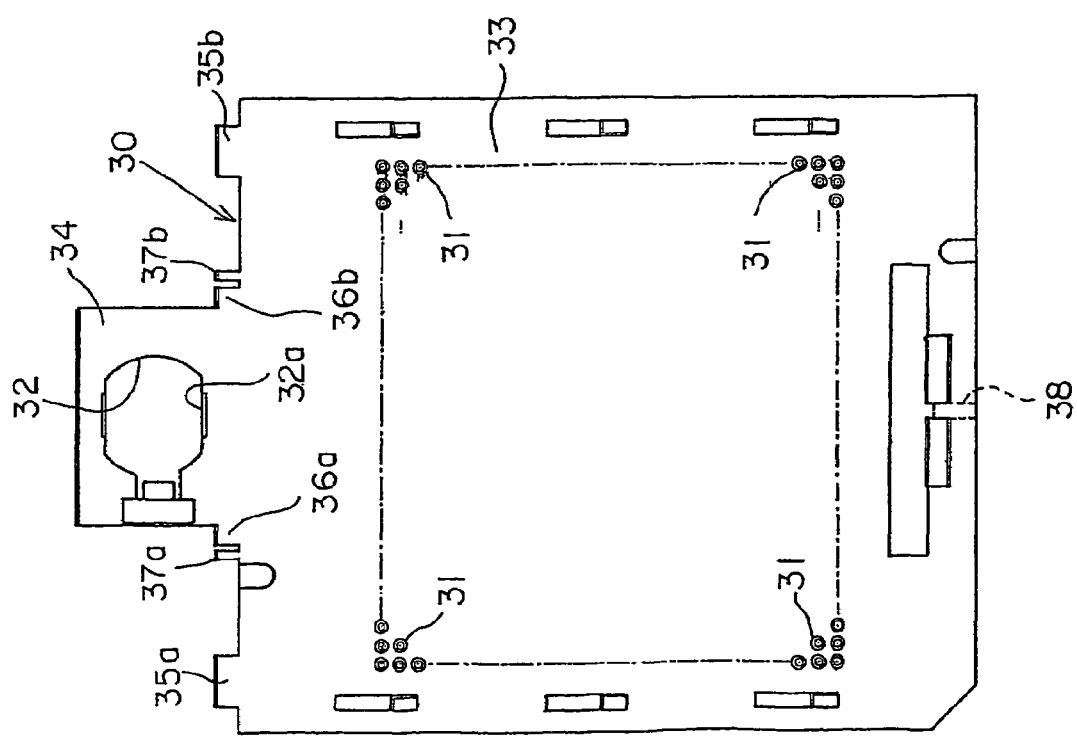
FIG. 3 is a top view of the slide plate of the PGA socket of FIG. 1.

As seen from FIG. 3, the slide plate 30 comprises a rectangular flat plate 33 having a rectangular projection 34 integrally connected to one lateral side. The rectangular projection 34 can be fitted in the rectangular recess 29 of the base housing 20, and the oblong-shaped aperture 32 is made at the center of the rectangular projection 34.

The rectangular flat plate 33 of the slide plate 30 has two narrow resilient projections 37a and 37b and two wide rigid projections 35a and 35b, which are formed on the lateral side on which the rectangular projection 34 is formed. The resilient projections 37a and 37b are close to the opposite sides of the rectangular projection 34 whereas the rigid projections 35a and 35b are arranged to be close to the opposite longitudinal sides of the rectangular flat plate 33 of the slide plate 30.

The projections 37a and 37b are so shaped and sized that when the slide plate 30 is laid on the base housing 20, the projections 37a and 37b may be inserted in the recesses 27a and 27b by allowing them to be yieldingly bent more or less toward the opposite sides of the rectangular projection 34 while sliding on the engagement walls 27c and 27d of the recesses 27a and 27b.

Figure 4:
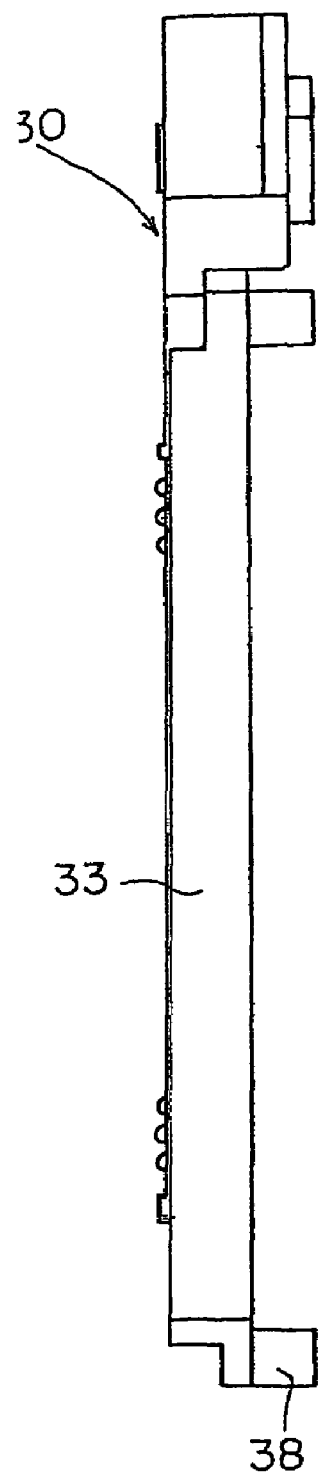
FIG. 4 is a side view of the slide plate of FIG. 3.

Referring to FIG. 4, the slide plate 30 has a projection 38 formed on the lateral side of the rectangular flat plate 33 opposite to the lateral side on which the cam member 22 is attached. The width of the projection 38 is somewhat larger than the space separating the resilient projections 25c and 25d. As such, the projection 38 is pinched tightly between the resilient projections 25c and 25d.

The slide plate 30 is laid and press-fitted on the base housing 20 by allowing its opposite "L"-shaped projections to be caught by the ridges formed on the opposite longitudinal sides of the base housing 20. In this position the slide plate 30 cannot be closely fitted on the base housing 20 because of the tolerance, and in the conventional PGA socket structure, therefore, the slide plate 30 cannot be moved on the base housing 20 without hitting each other with a rattling noise.

The slide plate 30 is moved in the direction opposite to the direction indicated by arrow A (FIG. 1). Then, the rectangular projection 34 of the slide plate 30 is pushed completely in the rectangular recess 29 of the base housing 20, allowing the resilient projections 37a and 37b and rigid projections 35a and 35b of the slide plate 30 to enter the recesses 27a, 27b and 28a and 28b of the base housing 20 respectively, and at the same time, allowing the projection 38 of the slide plate 30 to enter the gap between the resilient projections 25c and 25d of the base housing 20.

Then, the resilient projections 37a and 37b slide on the engagement walls 27c and 27d of the recesses 27a and 27b while being yieldingly bent more or less, thereby causing a resilient force to apply to either side of the slide plate 30, reducing the looseness between the slide plate 30 and the base housing 20. At the same time, the projection 38 is allowed to enter the gap between the resilient projections 25c and 25d. As a consequence the slide plate 30 is kept aligned with the center line D on the way to the final fitting position. Thus, the through holes 31 of the slide plate 30 and the terminals 21 of the base housing 20 can be aligned exactly, no matter how the number of the PGA lead pins may be increased (or no matter how the pin-to-pin space may be reduced).

In this particular embodiment use is made of two sets of resilient pieces 37a, 37b and 25c and 25d and engagement means 27c, 27d (in the form of wall surfaces) and 38 (in the form of projection). It should be noted that one set of resilient piece and engagement means suffices for the purpose of preventing the rattling, and that arrangement of the resilient piece-and-engagement means combination on one side of the longitudinal center line in place of the symmetric arrangement as in the above described embodiment suffices for the purpose.

While a preferred embodiment of the present invention is shown and described, it is envisioned that those skilled in the art may devise various modifications of the present invention without departing from the spirit and scope of the appended claims.

The invention claimed is:

1. A socket for a pin grid array package, the pin grid array package having a plurality of lead pin, the socket comprising:
   a base housing, the base housing having a plurality of terminals in terminal mounts; and
   a slide plate, the slide plate having a plurality of through holes and being movable between a first position in which the lead pins of the pin grid array package can be inserted in the through holes and the terminal mounts and a second position in which the lead pins are applied to the terminals in the terminal mounts, wherein one of the base housing and the slide plate has a pair of resilient pieces whereas the other of the base housing and the slide plate has a projection that is received between the pair of resilient pieces and wherein the pair of resilient pieces are not joined at a distal end.

2. The socket of claim 1, wherein the pair of resilient pieces is located on the base housing and the projection is located on the slide plate.

3. The socket of claim 2, wherein the distance between the pair of resilient pieces is less that the width of the projection.

4. The socket of claim 2, including a pair of rigid pieces located outboard of the resilient pieces.

5. The socket of claim 2, wherein the slide plate includes at least one resilient projection located on an end opposite the location of the projection, and wherein the base housing includes a recess for receiving the resilient projection.

6. The socket of claim 1, wherein the resilient pieces are engaged with the projection in such a manner so as to keep the slide plate center aligned when the slide plate is moved between the first position and the second position.

7. The socket of claim 2, wherein the projection is engaged with the resilient pieces in such a manner so as to keep the slide plate center aligned when the slide plate is moved between the first position and the second position.

8. The socket of claim 1, wherein the pair of resilient pieces is located on the slide plate and the projection is located on the base housing.

9. The socket of claim 8, wherein the distance between the pair of resilient pieces is less that the width of the projection.

10. The socket of claim 8, including a pair of rigid pieces located outboard of the resilient pieces.

11. The socket of claim 8, wherein the base housing includes at least one resilient projection located on an end opposite the location of the projection, and wherein the slide plate includes a recess for receiving the resilient projection.

12. The socket of claim 8, wherein the projection is engaged with the resilient pieces in such a manner so as to keep the slide plate center aligned when the slide plate is moved between the first position and the second position.

13. The socket of claim 1, wherein the pair of resilient pieces is arranged symmetrically with respect to a centerline of the base housing.

14. The socket of claim 2, wherein the pair of resilient pieces is arranged symmetrically with respect to a centerline of the base housing.

15. The socket of claim 8, wherein the pair of resilient pieces is arranged symmetrically with respect to a centerline of the base housing.

16. A socket for a pin grid array package, the pin grid array package having a plurality of lead pin, the socket comprising:
   a base housing, the base housing having a plurality of terminals in terminal mounts;
   a slide plate, the slide plate having a plurality of through holes and being movable between a first position in which the lead pins of the pin grid array package can be inserted in the through holes and the terminal mounts and a second position in which the lead pins are applied to the terminals in the terminal mounts, wherein one of the base housing and the slide plate has a pair of resilient pieces whereas the other of the base housing and the slide plate has a projection that is received between the pair of resilient pieces; and
   a pair of rigid pieces located outboard of the resilient pieces.

17. The socket of claim 16, wherein the pair of resilient pieces is arranged symmetrically with respect to a centerline of the base housing.

18. The socket of claim 16, wherein the pair of resilient pieces is located on the slide plate and the projection is located on the base housing.

19. The socket of claim 16, wherein the distance between the pair of resilient pieces is less that the width of the projection.

20. The socket of claim 16, wherein the resilient pieces are engaged with the projection in such a manner so as to keep the slide plate center aligned when the slide plate is moved between the first position and the second position.

* * * * *